United States Patent [19]

Snow et al.

[11] Patent Number: 4,808,510

[45] Date of Patent: Feb. 28, 1989

[54] PHOTOGRAPHIC ELEMENT AND PATTERNABLE MORDANT COMPOSITION

[75] Inventors: Robert A. Snow, Pittsford; Hugh G. McGuckin, Rochester; Ignazio S. Ponticello, Pittsford; Robert C. Daly, Rochester; Laurel J. Pace, Rochester; Sandra K. Fischer, Rochester; Michael J. Hanrahan, Rochester, all of N.Y.

[73] Assignee: Eastman Kodak Company, Rochester, N.Y.

[21] Appl. No.: 87,485

[22] Filed: Aug. 20, 1987

[51] Int. Cl.⁴ .............................................. G03C 1/76
[52] U.S. Cl. .................................. 430/287; 430/281; 430/518; 522/149; 522/152
[58] Field of Search ....................... 430/287, 518, 281; 522/149, 152

[56] References Cited

U.S. PATENT DOCUMENTS

| | | | |
|---|---|---|---|
| 3,709,690 | 1/1973 | Cohen et al. | 430/518 |
| 3,898,088 | 8/1975 | Cohen et al. | 430/518 |
| 3,958,995 | 5/1976 | Campbell et al. | 96/84 A |
| 4,315,978 | 2/1982 | Hartman | 430/4 |
| 4,353,972 | 10/1982 | Helling et al. | 430/213 |

FOREIGN PATENT DOCUMENTS 1594961  8/1981  United Kingdom .

OTHER PUBLICATIONS

Herkstroeter et al., Journal of Photochemistry, vol. 35, pp. 71-85 (1986).
Turro, Modern Molecular Chemistry, p. 352 (1970).
Murov, Handbook of Photochemistry, pp. 1-7 and 27-35.
Sanada et al., "New Deep UV Dyeable Negative Resist for CCD Micro Color Filter", SPIE, vol. 631, Advances in Resist Technology and Processing III (1986), pp. 187-191.
Research Disclosure, vol. 151, Nov. 1976, Item 15162.
Toshiba Kokai 79246/1984, based on Japanese Application No. 189,081/1982, filed Oct. 29, 1982.

Primary Examiner—Jack P. Brammer
Attorney, Agent, or Firm—Carl O. Thomas

[57] ABSTRACT

A photographically negative-working patternable mordant composition is disclosed containing a photocrosslinkable polymer comprised of, for providing both mordanting and crosslinking sites, repeating units of the formula:

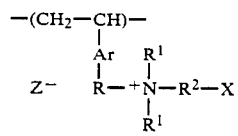

wherein
Ar is an aromatic linking group,
R is a methylene group,
$R^1$ is independently in each occurrence a lower alkyl group,
$R^2$ is a divalent linking group,
X is a photocrosslinking group, and
Z is a charge balancing counter ion.

The mordant composition can be coated on a support to form a photographic element.

11 Claims, No Drawings

PHOTOGRAPHIC ELEMENT AND PATTERNABLE MORDANT COMPOSITION

FIELD OF THE INVENTION

This invention relates to photographic elements and compositions capable of providing a mordant pattern in response to exposure and development.

BACKGROUND OF THE INVENTION

Mordants have been extensively investigated for use in photography. In dye image transfer photography mobile dye is transferred imagewise to a mordant uniformly coated on a receiver, usually in a gelatin binder which is hardened to give structural integrity to the coating. The mordant immobilizes the dye to product a viewable image. A discussion of image dye mordanting in image transfer photography is provided in *Research Disclosure*, Vol. 151, November 1976, Item 15162. *Research Disclosure* is published by Kenneth Mason Publications, Ltd., Emsworth, Hampshire P010 7DD, England, Campbell et al U.S. Pat. No. 3,958,995 illustrates a crosslinked mordnt useful in diffusion transfer photography. Wagner et al U.K. Pat. No. 1,594,961 discloses avoiding gelatin hardening by providing hardening sites in the mordant. Helling U.S. Pat. No. 4,353,972 discloses mordants which reduce dye wandering in image transfer photography by reacting with latex polymer particles.

More recently interest has developed in photographically forming dye mordanting domains in the course of forming filters for electronic image sensors. Forming color filter arrays useful with semiconductor sensors has proven particularly challenging because of the small individual sensor areas, commonly less than $1 \times 10^{-8}$ m$^2$ in area, with areas of less than $1 \times 10^{-10}$ m$^2$ often being sought.

A common approach that has been taken is to blend a mordant of the same type used for image transfer photography with a negative-working photoresist. Imagewise exposure of the photoresist followed by development leaves hardened photoresist and occluded mordant in exposed areas. Hartman U.S. Pat. No. 4,315,978 is illustrative of this approach.

While this approach to mordant patterning has proven workable, the filters produced have exhibited limitations, as might be expected. The mordants themselves, being borrowed from image transfer photography, have no imaging capability. The photoresists, developed primarily for use as protective, usually transient layers in semiconductor fabrication, have exhibited a variety of limitations, including significant optical density (both as initially coated and on aging) and limited solution stability. Further, the combination of both mordant and photoresist molecules in a single layer can mitigate against achieving thinner layers of satisfactory dye imparted optical densities.

Toshiba Kokai No. 79246/1984, based on Application No. 189,081/1982, filed Oct. 29, 1982, discloses a resist composition for forming color filter elements containing 4-vinyl-N-methylpyridinium pendant groups. However, it is observed that repeating units containing these pendant groups are to be limited to 10 percent or less on a mole basis to avoid composition poor in photosensitivity and incapable of forming an aqueous solution.

Sanada el al, "New Deep UV Dyeable Negative Resist for CCD Micro Color Filter", SPIE, Vol. 631, Advances in Resist Technology and Processing III (1986), pp, 187-191, discloses for use in forming filter elements for charge control devices quaternary salt terminated acrylate-glycidyl methacrylate copolymers which are crosslinked by bisazides. One difficulty of the approach is that a separate compound, the bisazide, is relied upon for crosslinking. Variances in proportions of reactants will, of course, lead to non-uniformity of results. Another fundamental difficulty is the necessity of employing very short ultraviolet (hereinafter also referred to as UV) wavelengths for crosslinking. This excludes from use the most common pattern forming exposure equipment specifically developed for fabricating semiconductor devices.

SUMMARY OF THE INVENTION

In one aspect this invention is directed to a photographically negative-working patternable mordant composition comprised of a triplet sensitizer capable of absorbing radiation in the visible and near ultraviolet portions of the spectrum and a photocrosslinkable polymer responsive to energy received from said triplet sensitizer comprised of, for providing both mordanting and crosslinking sites, repeating units of the formula:

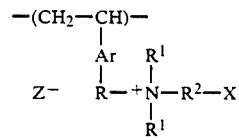

wherein
Ar is an aromatic linking group,
R is a methylene group,
$R_1$ is independently in each occurence a lower alkyl group,
$R^2$ is a divalent linking group,
X is a photocrosslinking group comprised of an activated vinyl moiety, and
Z is a charge balancing counter ion.

In another aspect this invention is directed to a negative-working photographic element comprised of a support and, coated on the support, a layer of a photographically negative-working patternable mordant composition of the type described above.

The present invention offers a number of distinct advantages over the prior state of the art. First, by providing a mordant polymer which is itself directly patternable by near UV and visible light the necessity of blending a photoresist polymer to perform the patterning function is eliminated. This increases the density of attainable mordanting sites and as a result allows thinner layers to provide a selected density of mordanted material—e.g., dye. The patternable mordant composition of this invention exhibits desirably low levels of optical density (low stain), both as initially formulated and on aging. The patternable mordant compositions of this invention are further advantageous in exhibiting high levels of stability, both in solution and after coating. The patternable mordant compositions of this invention can respond to imaging exposures within the wavelength ranges of the near ultraviolet and visible portions of the electromagnetic spectrum. The patternable mordant compositions can be processed using known aqueous and alcoholic developers.

The patternable mordant compositions can be readily adapted to serve a variety of applications. The proportion of mordanting and crosslinking sites to total weight can be independently varied. Either in addition to or as an alterative to immobilizing dye the patternable mordant compositions of this invention can be employed to immobilize any other imbibed anionic material of choice. The patternable mordant can also serve other uses, such as the etch resistance and planarizing functions commonly performed by photoresists. A further advantage of the patternable mordant compositions of this invention is that they can be readily formulated with the extremely low impurtiy metal concentrations desired for the reproducible manufacture of semiconductor devices. Finally, the patternable mordant compositions of this invention can be readily altered after coating so that they are no longer penetrable by imbibition processes.

Still other advantages of the invention will become apparent from the description of preferred embodiments and examples which follow.

DESCRIPTION OF PREFERRED EMBODIMENTS

This invention provides photographically negative-working patternable mordant compositions comprised of triplet sensitizers capable of absorbing radiation in the visible and near ultraviolet portions of the spectrum and photocrosslinkable polymers responsive to energy received from the triplet sensitizer comprised of at least one repeating unit for providing both mordanting and crosslinking sites.

The photocrosslinkable polymers employed in the compositions of this invention are linear polymers formed by the addition polymerization of ethylenically unsaturated monomers and subsequent modification of pendant groups to form mordanting and crosslinking sites. The photocrosslinking polymers contain at least one repeating unit capable of performing both a mordanting and crosslinking function of the type indicated by formula I:

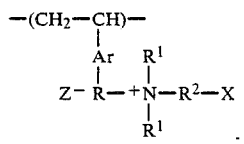

The repeating unit satisfying formula I can be formed by modifying the pendant group of a repeating unit in a linear addition polymer satisfying

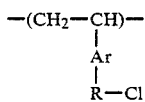

by reaction with a tertiary amine satisfying formula III:

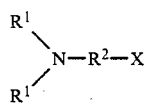

In each of formulae I, II, and III:
Ar is an aromatic linking group,
R is a methylene group,
$R^1$ is independently in each occurrence a lower alkyl group,
$R^2$ is a divalent linking group,
X is a photocrosslinking group comprised of an activated vinyl moiety, and
$Z^-$ is a charge balancing counter ion.

The aromatic linking group can be any convenient divalent aromatic group. The aromatic linking group is preferably an arylene group containing from 6 to 10 carbon atoms. Typical arylene groups are phenylene and naphthalene groups.

R is a methylene group. The methylene group can be an unsubstituted methylene group (i.e., a —CH$_2$— group) or any synthetically convenient subsituted methylene group. An exemplary methylene group substituent can be a halogen atom, such as chlorine, or a lower alkyl group. The term "lower alkyl" is employed throughout this specification to indicate alkyl groups containing from 1 to 3 carbon atoms—i.e., methyl, ethyl, n-propyl, and i-propyl groups. $R^1$ can be in each occurrence independently selected from among lower alkyl groups.

$R^2$ can be any synthetically convenient divalent linking roup. $R^2$ can be selected from among alkylene (e.g., alkylene of from 1 to 6 carbon atoms, such as methylene, ethylene, propylene, butylene, pentylene, hexylene, and any branched chain isomer of the foregoing); arylene (e.g., any of the forms of Ar defined above); arylenealkylene (e.g., composites of the alkylene and arylene moieties above containing from 7 to 16 carbon atoms); and —C(O)OR$^3$— or —C(O)NR$^3$—, where $R^3$ can take the form of any one of the divalent alkylene, arylene, and arylenealkylene moieties noted above.

X is a photocrosslinking group comprised of an activated vinyl moiety. A preferred activated vinyl moiety is an activated vinyl aryl moiety, such as those satisfying formula IV or V:

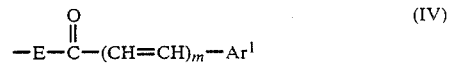

or

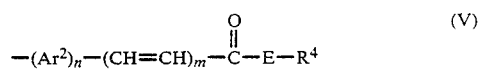

where:
Ar$^1$ is an aromatic moiety;
Ar$^2$ is a divalent aromatic moiety;
E is an oxy or imino moiety;
m is 1 or 2;
n is 0 or 1; and
R$^4$ is a terminal hydrocarbon group.

The aromatic moiety Ar$^1$ can take the form of any convenient aromatic nucleus. The aromatic nucleus can take the form of a five or six membered aromatic ring bonded directly to the vinyl group in formula IV. The aromatic ring can be either heterocyclic or carbocyclic. Aromatic heterocyclic ring substituents containing one or two chalcogen heteroatoms, such as 2-thienyl, 3-thienyl, 2-furyl, 3-furyl, and fused carbocyclic ring analogues thereof, are specifically contemplated. To avoid competition in the quaternization reaction the heterocyclic aromatic ring preferably does not contain a nitrogen atom. The aromatic nucleus can alternatively take the form of an aromatic carbocyclic nucleus, such as a phenyl or naphthyl nucleus. The aromatic nucleus can be either substituted or unsubstituted. For example, one or more alkyl substituents of from 1 to 6 carbon atoms are contemplated. It is generally preferred that the aromatic moiety contain less than about 15, optimally less than 12 total carbon atoms.

$Ar^2$ can be any convenient divalent aromatic moiety. For example, $AR^2$ can differ from the aromatic moiety $AR^1$ described above solely in being divalent rather than monovalent. In a specifically preferred form $Ar^2$ is a divalent arylene moiety of the type described above in connection Ar.

In each instance there is a direct bond between an aromatic ring carbon atom of $Ar^1$ and $AR^2$ and the vinyl groups of formulae IV and V, respectively. When $R^2$ terminates in an arylene group, it is apparent that having the arylene group $AR^2$ also present would result in two successive arylene groups separating the quaternized nitrogen atom of formula I and the vinyl group of formula V. Therefore, in this instance n is preferably zero.

The oxycarbonyl or iminocarbonyl moiety —E—C—(O)— is an electron withdrawing group that acts in combination with the aromatic ring attached to the opposite terminus of the vinyl group in formulae IV and V to provide a suitably activated vinyl group. The third bond of the imino nitrogen atom can be satisfied by hydrogen or any convenient hydrocarbon substituent, such as alkyl of from 1 to 6 carbon atoms, optimally a lower alkyl group, or an aromatic group of from 6 to 10 carbon atoms (e.g., phenyl or naphthyl). The oxy and imino moieties facilitate sensitization in the near ultraviolet and visible regions of the spectrum.

$R^4$ can be any convenient terminal hydrocarbon group. $R^4$ can be an aryl group, preferably of from 6 to 10 carbon atoms (e.g., phenyl or naphthyl) or an alkyl group, preferably of from 1 to 6 carbon atoms, optimally a lower alkyl group.

It is appreciated that the activated vinyl aromatic moieties of formulae IV and V are merely exemplary of some of the simpler of many varied forms that these groups can take. Activated vinyl aromatic moieties with plural vinyl groups, elaborated linking groups, or containing other heteroatoms are all possible, but are not required and in many instances encumber the synthesis or bulk of the mordant without offering compensating advantage.

Specifically preferred pendant mordanting and crosslinking groups are formed by esterifying a tertiary amine of formula VI

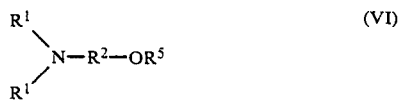

(VI)

with cinnamic acid or an analogous acid to produce the tertiary amine VII

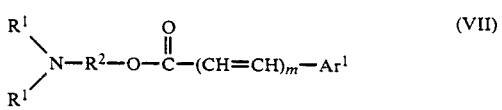

(VII)

where
$Ar^1$, m, $R^1$, and $R^2$ are as previously defined and $R^5$ is hydrogen or a terminal hydrocarbon group,
preferably of the type indicated above in connection with $R^4$.

Although the foregoing activated vinyl moieties are preferred, other variations in their structural form are possible. For example, the activated vinyl moiety can take the form indicated by formula VIII:

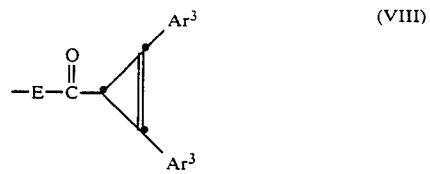

(VIII)

where
$Ar^3$ are indpendently selected as indicated above in connection with $Ar^1$ and
E is selected as previously described.

In a specifically preferred form the activated vinyl moiety of formula VIII takes the form of an oxycarbonyl-3-(1,2-diarylpropene).

$Z^-$ can be any convenient charge balancing counter ion. If the synthetic route indicated by formulae II and III is followed in preparing the repeating unit of formula I, $Z^-$ will initially be a chloride anion. However, the chloride anion can be readily exchanged with any other convenient anion, such as bromide, iodide, p-toluene sulfonate, trifluoroborate, etc.

Since the repeating units of formula I provide both a mordanting and crosslinking capability, they can form the entire patternable mordant polymer molecule. The repeating units of formula I can take any combination of the varied forms described above within a single polymer molecule. It is generally synthetically convenient to form all of the repeating units of formula I at once. Mixtures of tertiary amines satisfying formula III can be conveniently employed to vary the structure of the repeating units formed. In a specifically contemplated form of the invention the patternable mordant is a homopolymer in which the repeating units of formula I are formed by reacting a single polymeric repeating unit satisfying formula II with a single tertiary amine satisfying formula III.

While forming the entire patternable mordant of repeating units satisfying formula I is contemplated, it is not required. Satisfactory photocrosslinking to permit selective removal by development of unexposed polymer can be achieved when only a minor proportion of the patternable mordant molecule is comprised of repeating units satisfying formula I. It is preferred that at least 20 percent on a mole basis of the repeating units making up the patternable mordant satisfy formula I. In more preferred patternable mordants from about 30 to 60 percent, on a mole basis, of the repeating units satisfy formula I.

While not every repeating unit of the patternable mordant need provide a crosslinking site, it is generally preferred for maximum mordanting capacity that each of the repeating units provide a mordanting site. A patternable mordant containing, in addition to the repeating units of formula I providing both mordanting and crosslinking sites, repeating units capable of mordanting, but not crosslinking, can be conveniently formed by blending a tertiary amine satisfying formula IX with a tertiary amine satisfying formula III and then reacting the mixture with a polymer having repeating units satisfying formula II,

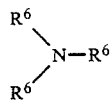

wherein $R^6$ is independently in each occurrence a hydrocarbon group or an oxy substituted hydrocarbon group containing from 1 to 16 carbon atoms, provided that in at least two occurrences $R^6$ contains from 1 to 3 carbon atoms.

The hydrocarbon moieties of $R^6$ are preferably chosen from among alkyl, including cycloalkyl, or alkenyl containing from from 1 to 6 carbon atoms, aryl containing 6 to 10 carbon atoms, or alkaryl containing 7 to 16 carbon atoms.

In at least one occurrence $R^6$ can and preferably is chosen to enhance the characteristics of the patternable mordant in one or more respects. When $R^6$ is an alkenyl group, it can provide an auxiliary crosslinking site. For example, $R^6$ can provide a site for thermally induced crosslinking. In a specifically preferred form $R^6$ is an allyl group. When $R^6$ contains an oxy substituent, such as a hydroxy or alkoxy ($C_{1-3}$) substituent, it can promote adhesion of overcoated polymeric layers. For example, in forming filter elements employing patternable mordants, it is contemplated that successive layers may be coated, each imbibed with a different dye to be mordanted. Particularly preferred oxy substituted alkyls are omega-hydroxyalkyls—e.g., β-hydroxyethyl, γ-hydroxypropyl, β,γ-dihydroxypropyl, and the like.

The tertiary amine of formula IX competes with the tertiary amine of formula III to form repeating units satisfying formula X:

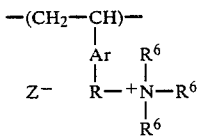

where Ar, R, $R^6$, and $Z^-$ are as previously described.

From the foregoing it is apparent that the patternable mordants of the invention can be readily formed with every repeating unit of the mordant polymer providing a mordanting site and with the ratio of mordanting sites to crosslinking sites being readily controlled, as desired, merely by selecting the ratio of tertiary amines satisfying formulae III and IX.

Although the invention is capable of providing a mordanting site within each repeating unit of the patternable mordant polymer and this is usually preferred, the invention is not restricted to this form. If, instead of choosing a homopolymer satisfying formula II another conventional polymer having only a portion of its repeating units satisfying formula II is substituted, it is apparent that the number of mordanting sites can be regulated at will. In addition to the formula II repeating units the starting polymer can contain any one or combination of conventional vinyl addition polymer repeating units. For example, acrylic and methacrylic acid, ester, and amide repeating units; vinyl alcohol; styrene repeating units; and alkylene (e.g., ethylene and propylene) repeating units are all contemplated. It is generally preferred that repeating units satisfying formulae I and X account for at least 50 percent, optimally at least 90 percent, on a mole basis of the patternable mordant.

The patternable mordants of this invention are linear polymers which can be dissolved in hydrogen bonding polar solvents. Preferred polymers are those which can be dispersed in aqueous or alcoholic solutions. Polymer molecular weights (weight average) in the range of from about 20,000 to 200,000 preferably about 40,000 to 150,000, are well suited to achieving clean removal by common developers. Polymer molecular weights, unless otherwise indicated are understood to be measured by the size exclusion chromatography method, described in detail in "Modern Size Exclusion Chromotography", W. W. Yau, J. J. Kirkland, and D. D. Bly, Wiley Interscience, J. Wiley & Sons, 1979. The weights are related to polystryene standards.

While the activated vinyl groups of the patternable mordant polymer are capable of responding directly to shorter wavelength UV radiation, to achieve photocrosslinking by exposure to the near UV and visible portions of the spectrum a sensitizer is incorporated in the mordant composition.

In accordance with the definition appearing in *Hackh's Chemical Dictionary*, 4th Ed., McGraw-Hill, 1969, the term "near UV" refers to the portion of the ultraviolet spectrum extending from 290 to 390 nm. The preferred mordant compositions of this invention are responsive to radiation in the spectral region of from about 300 to 450 nm.

Any conventional, conveniently solubilizable sensitizer of the type which relies upon absorption and transfer of exposing energy to the mordant polymer for sensitization can be employed. Such sensitizers are most commonly triplet sensitizers and are to be distinguished from electron transfer type sensitizers. Exposing photons are captured by the sensitizer. Each captured photon raises the energy level of an electron from an occupied molecular orbital (ground state) to an excited state, referred to as a singlet state. The duration of the singlet excited state is limited, typically less than a few nanoseconds. An excited electron returning from its singlet excited state directly to its original ground state usually dissipates the captured photon energy. Alternatively,, the singlet excited state photosensitizer in some instances undergoes intersystem crossing through electron spin inversion to another excited state, referred to as a triplet state, wherein lifetimes are typically in the microsecond to millisecond range. This much longer excited state interval increases the probability of energy transfer to the mordant polymer to be crosslinked.

As herein employed the term "triplet state sensitizer" refers to any conventional energy transfer sensitizer exhibiting an intersystem crossing efficiency from its singlet to triplet states in excess of about 20 percent. Preferred triplet sensitizers are those exhibiting intersystem crossing efficiencies in excess of 50 percent.

Among specifically preferred classes of triplet sensitizers are 3-substituted coumarins. Such sensitizers are disclosed by Specht et al U.S. Pat. No. 4,147,552, the disclosure of which is here incorporated by reference. Specht, Martic, and Farid, "A New Class of Triplet Sensitizers", *Tetrahedron*, Vol. 38, pp. 1203–1211, 1982, discloses amino-substituted keto-coumarins which exhibit intersystem crossing efficiencies ranging up to 92 percent.

Specifically preferred 3-substituted coumarin sensitizers are those satisfying formula XI:

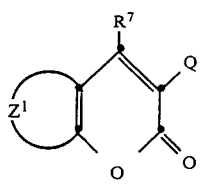

(XI)

wherein $R^7$ is hydrogen, lower alkyl, or aryl of from 6 to 10 carbon atoms;

Q is —CN or —$X^1$—$R^8$;

$R^8$ is alkyl of from 1 to 12 carbon atoms; alkenyl of from 2 to 12 carbon atoms; aryl of from 6 to 10 carbon atoms; a carbocyclic group of from 5 to 12 carbon atoms; or a heterocyclic group containing from 5 to 15 nuclear carbon and hetero atoms;

$X^1$ is carbonyl, sulfonyl, sulfinyl, or arylenedicarbony; and $Z^1$ represents the atoms completing an aromatic carbocyclic nucleus.

In specifically preferred forms 3-substituted coumarin sensitizers $X^1$ is carbonyl or sulfonyl and $R^8$ is comprised of an azinium ring (e.g., pyridinium or quinolinium) or satisfies formula XII:

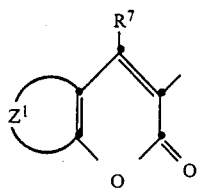

(XII)

wherein $R^7$ and $Z^1$ can take any of the forms described above to complete a symmetrical or nonsymmetrical bis-coumarin.

Among other preferred forms of the triplet sensitizers are those disclosed in Van Allan et al U.S. Pat. Nos. 4,062,686 and 4,119,466, the disclosures of which are here incorporated by reference. These preferred triplet sensitizers are 2-(heterocyclcarbonylmethylene)thiazolines and selenazolines as well as 2-[di(heterocyclylcarbonyl)methylene]thiazolines and selenazolines.

Specifically preferred thiazoline and selenazoline triplet sensitizers are those of formula XIII:

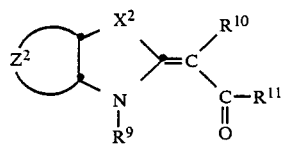

(XIII)

wherein $R^9$ is a lower alkyl group:

$R^{10}$ is hydrogen or —C(O)$R^{10}$;

$R^{11}$ is a heterocyclic group, such as furyl or thienyl; and $Z^2$ represents the atoms completing an aromatic carbocyclic nucleus.

The triplet sensitizer is admixed with the patternable mordant polymer in a concentration of from about 0.1 to 100 percent, preferably 5 to 25 percent, by weight based on the weight of the polymer to be sensitized.

No other ingredients beyond the mordant polymer and the sensitizer are required to form a patternable mordant composition according to this invention.

To form a photographic element according to the invention only a single coating of the mordant composition on a support is required. The support can be a conventional photographic element support. For example, any of the photographic supports disclosed in *Research Disclosure*, Vol. 176, December 1979, Item 17643, Section XVII, can be employed. Transparent supports, such as photographic film supports, are particularly contemplated where separate color filter arrays are to be formed. In other instances the color filter array to be formed can be integrated with the device intended to receive light transmitted through the filter array. In such instance the receiving element, such as a semiconductor device, or a separating interlayer can provide the support for the photographic element.

In a preferred form of the invention the mordant polymer both before and after patterning is "colorless"—quantitatively defined as exhibiting an absorption of less than 0.02 density unit, preferably less than 0.01 density unit, within the visible spectrum at coating thicknesses of up to 25 μm. None of the repeating units I, II, and X contain a chromophore capable of contributing color within the visible spectrum. Further, the common repeating units of vinyl addition polymers, including those named above, that might be employed for producing copolymers similarly lack chromophores.

To the extent that the sensitizers absorb light within the near UV portion of the spectrum they need not be colored. Where a colorless sensitizer is employed, it is immaterial whether it remains in the patterned mordant or is removed.

The sensitizers which absorb light within the visible spectrum necessarily impart a color to the mordant composition. Fortunately, the same development and washing procedures which remove mordant in unexposed areas also effectively remove the preferred sensitizers described above from exposed areas. Should a sensitizer be encountered which is not removed on normal development and washing, it is recognized that the smaller sensitizer concentrations contemplated are in the themselves adequate to minimize unwanted retained color in the patterned mordant composition in many instances.

Any conventional mordantable anionic dye can be employed in the mordant compositions of this invention. The mordantable dyes disclosed by McGuckin and Cohen U.S. Pat. No. 4,220,700, here incorporated by reference, are cited as illustrative. Further, any of a variety of materials having physical properties like those of anionic dyes can be usefully immobilized by the mordant compositions of this invention. For example, ultraviolet absorbers, photographic couplers, and the like can all be usefully mordanted by the use of the present invention. All references to mordantable dye are to be understood as applying also to other mordantble materials.

In certain applications it is desired to prevent dye from entering the patterned mordant layer. This can arise, for example, where the patternable mordant is employed to form a planarizing layer which is later is brought into contact dye, as can result from forming a filter element on the surface of the planarizing layer. Dye entrance into the patterned mordant layer can be prevented by heating the patterned mordant to a temperature of 200° C. for 60 seconds. Introduction of energy into the mordant layer in other forms can achieve a similar result.

While the foregoing description of the invention has been directed to simple, preferred embodiments, it is appreciated that the invention can be varied in a number of ways readily apparent to those skilled in the art. For example, while the mordant composition has been described as being an alternative to conventional photoresist-mordant blends, it is appreciated that combinations of the mordant composition disclosed above with conventional photoresists, mordants, or photoresist-mordant blends are possible. Further, the common supplementary ingredients of conventional negative-working photoresists, such as soluble binders and the like, can be compatibly employed with the mordant compositions of this invention, though their use is not essential.

The invention can be better appreciated by reference to following specific examples:

PREPARATION 1

Preparation of 2-N,N-dimethylaminoethyl cinnamate

To a mechanically stirred solution of 2-N,N-dimethylaminoethanol 9.0 g (0.10 mol) in 100 ml of methylene chloride cooled to 0° C. under argon was added, dropwise, 16.7 g (0.10 mol) of freshly distilled cinnamoyl chloride in 100 ml of methylene chloride. The reaction mixture was stirred at room temperature overnight, the solvent was evaporated, and the residual solid was dissolved in 100 ml of water. This solution was treated with 1 equivalent of 1N sodium hydroxide solution, and the liberated amine was extracted into 3×150 ml portions of ether. The combined ether portions were washed with water and then with saturated sodium chloride solution, dried over sodium sulfate, filtered, and the solvent was evaporated. The residual oil was distilled through a 3 inch Vegreus TM column at 180° C./1.5 mm Hg to give 19.4 g (88.5%) of the desired material which exhibited the following properties:

mass spectrum, m/e M+ =219; $^1$H nmr ($\delta$, CDCl$_3$) 2.32 (s, 6H, N—CH$_3$), 2.14 (t, 2H, CH$_2$—N), 4.31 (t, 2H, CH$_2$—O), 6.45 (d, 1H, J=16 Hz, vinyl =CH—C(—O)), 7.20 (d, 1H, J=16 Hz, vinyl=CH—aryl), 7.36 (m, 3H, aromatic) and 7.51 ppm (m, 2H, aromatic; $^{13}$C nmr ($\delta$, CDCl$_3$) 166.3 (C=O), 144.3 (vinyl =CH—aryl(133.9 (aromatic C-1), 129.7 (aromatic C-4), 128.4 and 127.6 (aromatic C-2, C-6 and C-3, C-5), 117.6 (vinyl=CH-=CO), 61.7 O—CH$_2$), 57.4 (N—CH$_2$), and 45.2 ppm (N—CH$_3$).

Anal. Calc'd. for C$_{13}$H$_{17}$NO$_2$: C, 71.2; H, 7.8; N, 6.4, Found: C, 71.4; H, 7.8; N, 6.2.

PREPARATION 2

Preparation of 3-N,N-dimethylaminopropyl cinnamate

This material was prepared in a fashion analogous to that used in preparation 1 to give 88.3% yield of an oil which exhibited the following properties:

b.p. 142° C./0.1 mm Hg; mass spectrum, m/e M+ =233; $^1$H nmr ($\iota$, CDCl$_3$) 7.63 (d, 1H, J=16 Hz, vinyl=CH—aryl), 7.46 (m, 2H, aromatic), 7.32 (m, 3H, aromatic), 6.41 (d, 1H, J=16 Hz, vinyl=CH—C(=O)), 4.35 (t, 2H, CH$_2$—O), 2.24 (t 2H, CH$_2$—N, 2.20 (s, 6H, CH$_3$—N), and 1.90 ppm (m, 2H, CH$_2$—CH$_2$—CH$_2$); $^{13}$C nmr ($\iota$, CDCl$_3$) 166.8 (C=O), 144.6 (=CH—aryl), 134.4 (aromatic C-1), 130.2 (aromatic C-2), 128.8 and 128.0 (aromatic C-2, C-6, and C-3, C-5), 118.1 (vinyl=CH—CO), 62.8 (CH$_2$—O), 56.1 (CH$_2$—N), 45.3 (CH$_3$—N), and 27.0 ppm (C—CH$_2$—C).

Anal. calcd. for C$_{14}$H$_{19}$NO$_2$: C, 72.1; H, 8.2; N, 6.0, Found: C, 72.0; H, 8.2; N, 5.8.

PREPARATION 3

Preparation of 2-N,N-dimethylaminoethyl 3-(2-thienyl)-2-propenoate

This material was prepared in a fashion analogous to that used in preparation 1 to give 91.2% yield of an oil which exhibited the following properties:

b.p. 140° C./0.1 mm Hg; $^1$H nmr ($\delta$, CDCl$_3$) 7.76 (d, 1H, J=16 Hz, acrylate vinyl=CH—thienyl), 7.34 and 7.23 (pair of d's, 2H, thienyl H-3 and H-5), 7.04 (m, 1H, thienyl H-4), 6.26 (d, 1H, J=16 Hz, acrylate= CH—C=O), 4.27 (t, 2H, CH$_2$—O), 2.13 (t, CH$_2$—N) and 2.30 ppm (s, 6H CH$_3$—N); $^{13}$C nmr ($\delta$, CDCl$_3$) 166.3 (C=O), 139.2 (thienyl C-2), 136.9 (vinyl=CH—thienyl), 130.5 (thienyl C-5), 128.1 and 127.7 (thienyl C-3 and C-4), 116.7 (vinyl—C—C—C=O), 61.8 (CH$_2$—O), 57.6 (CH$_2$—N), and 45.4 ppm (CH$_3$—N).

Anal. calc'd. for C$_{11}$H$_{15}$NO$_2$S: C, 58.6; H, 6.2; N, 14.2, Found: C, 58.4; H, 6.9; N, 14.5.

PREPARATION 4

Preparation of 2-N,N-dimethylaminoethyl 3-(2-furyl)-2-propenoate

This material was prepared in a fashion similar to that used in preparation 1 to give 88% yield of an oil with the following properties:

b.p. 128° C./0.25 mm Hg; mass spectrum m/e M+ =209; $^1$H nmr ($\delta$, CDCl$_3$) 7.46 (d, 1H, furanyl H-5), 7.41 (d, 1H, J=16 Hz, vinyl=CH—furanyl), 6.60 (d, 1H, furanyl H-3), 6.45 (m, 1H, furanyl H-4), 6.35 (d, 1H, J=16 Hz, vinyl=CH—C=O), 4.28 (t, 2H, CH$_2$—O), 2.64 (t, 2H, CH$_2$—N), and 2.33 ppm (s, 6H, CH$_3$—N); $^{13}$C nmr ($\delta$, CDCl$_3$) 166.3 (C=O), 150.4 (furanyl C-2, 144.3 (furanyl C-5, 130.7 (vinyl =CH—furanyl), 115.3 and 114.2 (furanyl C-3 and vinyl =CH—C=O), 111.8 (furanyl C-4), 61.8 (CH$_2$—O), 57.4 (CH$_2$—N), and 45.3 ppm (CH$_3$—N).

Anal. cald'd. for C$_{11}$H$_{15}$NO$_3$: C, 63.1; H, 7.2; N, 6.7, Found: C, 63.2; H, 7.2; N, 6.1.

PREPARATION 5

Preparation of 3-N,N-dimethylaminopropyl 3-(2-furyl)-2-propenoate

This material was prepared in a fashion similar to that used in preparation 1 to give 86.8% yield of an oil with the following properties:

b.p. 120° C./0.15 mm Hg; mass spectrum m/e M+ =223; $^1$H nmr ($\delta$, CDCl$_3$( 7.48 (d, 1H, furanyl H-5), 7.42 (d, 1H, J=16 Hz, vinyl=CH—furanyl), 6.59 (d, 1H, furanyl H-3), 6.43 (m, 1H, furanyl H-4), 6.28 (d, 1H, J=16 Hz, vinyl=CH—C=O), 4.22 (t, 2H, CH$_2$—O), 2.36 (t, 2H, ch$_2$—N), 2.22 (s, tH, CH$_3$—N), and 1.84 ppm (m, 2H, C—CH$_2$—C); $^{13}$C nmr ($\delta$, CDCl$_3$) 166.4 (C=O), 150.5 (furanyl C-2), 144.3 (furanyl C-5), 130.6 (vinyl=CH—furanyl), 115.5 (vinyl =CH—C=O), 114.3 (furanyl C-3, 111.9 (furanyl C-4), 62.4 (CH$_2$—O), 55.8 (CH$_2$–N), 45.1 (CH$_3$–N), and 26.7 ppm (C–CH$_2$–C).

Anal. calc's. for C$_{12}$H$_{17}$NO$_3$: C, 64.6; H, 7.7; N, 6.3, Found: C, 64.5; H, 7.4; N, 5.5.

PREPARATION 6

Preparation of 3-N,N-dimethylaminopropyl cinnamide

To a mechanically stirred, ice-cooled solution of 62 g (0.60 mol) of 3-N,N-dimethylpropylamine in 200 ml of methylene chloride was added a solution of cinnamoyl chloride (100 g, 0.60 mol) in 200 ml of methylene chloride over one hour. The reaction mixture was allowed to stir at room temperature overnight, then was cooled in an ice-bath and treated with a slight excess of 1N NaOH solution. The methylene chloride solution was then washed with water and saturated sodium chloride solution, dried with sodium sulfate, and the solvent was evaporated to leave an oil which was vacuum distilled at 205° C./1.0 mm Hg to give a 68.9% yield of the desired product. This material exhibited the following properties:

mass spectrum, m/e M+ =232; $^1$H nmr ($\delta$, CDCl$_3$) 7.57 (d, 1H, J=16 Hz, vinyl=CH-aryl), 7.48 (m, 2H, aromatic), 7.33 (m, 3H, aromatic), 7.21 (s, 1H, exchanged with D$_2$O, —C(=O)—NH—), 6.34 d, 1H, J=16 Hz, vinyl =CH—CO), 3.48 (m, 2H, —CH$_2$—N—H—C=O), 2.40 (t, 2H, CH$_2$—N), 2.24 (s, 6H, CH$_3$—N), and 1.71 ppm (m, 2H, C—CH$_2$—C); $^{13}$C nmr ($\delta$, CDCl$_3$) 165.8 (C=O), 140.0 (vinyl =CH-aryl), 134.9 (aromatic C-1), 129.3 (aromatic C-4), 128.6 and 127.5 (aromatic C-2, C-6m and C-3, C-5), 121.4 (vinyl =CH—C=O), 58.5 (CH$_2$—N), 45.3 (CH$_3$—N), 39.4 (CH$_2$—NH—C=O), and 26.1 ppm (C—CH2—C).

Anal. calc'd. for C$_{14}$H$_{20}$NO$_3$O: C, 72.4; H, 8.7; N, 12.1, Found: C, 72.1; H, 8.7; N, 12.1.

PREPARATION 7

Preparation of poly(chloromethylstyrene)

A mechanically stirred solution of 953.9 g (6.25 mol) of freshly distilled chloromethylstyrene as a 60/40 mixture of meta and para isomers in 954 g of toluene containing 5.13 g (0.03125 mol) of 2,2'-azobis(2-methylpropionitrile) was deoxygenated by nitrogen ebullition for 45 minutes, then heated to 60° C. for 15 hours, cooled to ambient temperature, and diluted with 700 ml of tetrahydrofuran. The polymer was precipitated into 18 l of methanol, isolated by filtration, triturated for one hour with 2 l of methanol, filtered, washed with additional methanol, and dried in a Buchner funnel by sucking air through it for 24 Hours.

Yield: 601 g (63%) of a white powder. Gel permeation chromatography ing tetrahydrofuran using a micro-styrogel 10$^6$ to 10$^3$ porosity column indicated a dispersity of 2.79; Mn=26×10$^3$; Mw=74×10$^3$; mz=143×10$^3$ when referenced to polystyrene.

Anal. calc'd. for C$_9$H$_9$Cl: C, 70.8; H, 5.9; N, 23.2, Found: C, 71.0; H, 6.0; N, 23.3.

PREPARATION 8

Preparation of poly-[N-(2-cinnamatoethyl)-N,N-dimethyl-N-vinyl benzyl ammonium chloride-co-N-(3-hydroxypropyl)-N,N-dimethyl-N-vinyl benzyl ammonium chloride (60/40 molar ratio)] (Compound 11)

In a 100 ml hypovial a solution of 11.49 g (0.0753 equivalents) of poly(chloromethylstyrene) from preparation 7 in 35 ml of dimethylformamide (DMF) was treated with a solution 9.91 g (0.0452 equivalents) of 3-N,N-dimethylaminopropyl cinnamate from preparation 1 in 10 ml of DMF. The reaction mixture was ebullated with argon for 5 minutes, and the vial was then stoppered and sealed with a silicone rubber stopper and aluminum crimp cap, placed in a constant temperature bath at 60° C. and rotated axially at a 30° angle for 100 minutes. The vial was then cooled to ambient temperature in a water bath, opened, and the reaction mixture was treated with swirling with a solution of 3.48 g (0.0336 equivalents) of 3-N,N-dimethylaminopropanol in 7 ml of methanol. The vial was again stoppered and sealed, shaken to ensure a homogeneous distribution of reagents, and again rotated at 60° C. for 2 hours. The vial was then cooled to ambient temperature, opened, and the reaction mixture was diluted to 250 ml with methanol. The polymer was precipitated into 3 l of ethyl acetate, isolated by filtration, triturated with 1.1 of ethyl acetate, filtered, washed with ethyl acetate, and dried in a Buchner filter funnel by sucking air through it for 24 hours.

Yield: 26 g.

Anal. calc'd. for C$_{94}$H$_{122}$Cl$_5$N$_5$O$_8$: C, 69.4; H, 7.6; N, 4.3; Cl, 10.9, Found: C, 69.1; H, 7.5; N, 4.2; Cl, 11.1.

Some additional patternable mordants that are part of this invention are listed in Table I and corresponding combustion analysis results are listed in Table II. The polymers were prepared according to the fashion described in Preparation 8 with appropriate adjustments made to allow for changes in the respective molecular weights and molar ratios of the amines used. Compositions of the patternable mordants that satisfy the goals and advantages of this invention are not limited to those included in these tables.

TABLE I

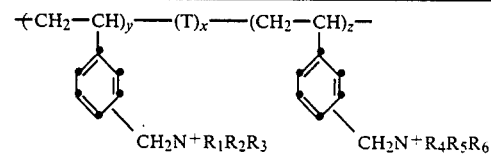

| Compound | y | z | R$_1$ | R$_2$ | R$_3$ | R$_4$ | R$_5$ | R$_6$ |
|---|---|---|---|---|---|---|---|---|
| 1 | 60 | 40 | A | M | M | M | M | M |
| 2 | 100 | 0 | A | M | M | — | — | — |
| 3 | 70 | 30 | A | M | M | M | M | M |
| 4 | 60 | 40 | A | M | M | G | M | M |
| 5 | 40 | 60 | A | M | M | G | M | M |
| 6 | 60 | 40 | A | M | M | I | M | M |
| 7 | 50 | 50 | A | M | M | H | M | M |
| 8 | 40 | 60 | A | M | M | H | M | M |
| 9 | 30 | 70 | A | M | M | H | M | M |
| 10 | 20 | 80 | A | M | M | H | M | M |
| 11* | 60 | 40 | A | M | M | H | M | M |
| 12 | 60 | 40 | A | M | M | L | M | M |
| 13 | 50 | 50 | A | M | M | M | M | M |
| 14 | 50 | 50 | A | M | M | K | M | M |
| 15 | 60 | 40 | A | M | M | J | J | J |
| 16 | 100 | 0 | C | M | M | — | — | — |
| 17 | 90 | 10 | C | M | M | M | M | M |
| 18 | 80 | 20 | C | M | M | M | M | M |
| 19 | 70 | 30 | C | M | M | M | M | M |
| 20 | 60 | 40 | C | M | M | M | M | M |
| 21 | 50 | 50 | C | M | M | I | I | I |
| 22 | 90 | 10 | C | M | M | O | M | M |
| 23 | 80 | 20 | C | M | M | O | M | M |
| 24 | 70 | 30 | C | M | M | O | M | M |
| 25 | 50 | 40 | C | M | M | O | M | M |
| 26 | 90 | 10 | C | M | M | K | M | M |
| 27 | 80 | 20 | C | M | M | K | M | M |
| 28 | 70 | 30 | C | M | M | K | M | M |
| 29 | 60 | 40 | C | M | M | K | M | M |
| 30 | 50 | 50 | C | M | M | K | M | M |
| 31 | 60 | 40 | C | M | M | I | M | M |
| 32 | 60 | 40 | B | M | M | M | M | M |

TABLE I-continued

| Compound | y | z | R₁ | R₂ | R₃ | R₄ | R₅ | R₆ |
|---|---|---|---|---|---|---|---|---|
| 33 | 60 | 40 | B | M | M | I | M | M |
| 34 | 60 | 40 | B | M | M | H | M | M |
| 35 | 60 | 40 | B | M | M | H | M | M |
| 36 | 60 | 40 | B | M | M | O | M | M |
| 37 | 60 | 40 | B | M | M | N | M | M |
| 38 | 60 | 40 | D | M | M | M | M | M |
| 39 | 60 | 40 | F | M | M | M | M | M |
| 40 | 60 | 40 | E | M | M | — | — | — |
| 41.bf | 41 | 27 | A | M | M | M | M | M |
| 42.cd | 50 | 30 | C | M | M | K | M | M |
| 43.ce | 40 | 30 | C | M | M | K | M | M |
| 44.gh | 40 | 30 | A | M | M | H | M | M |
| 45 | 60 | 40 | P | M | M | H | M | M |
| 46 | 60 | 40 | F | M | M | H | M | M |

*Preparation 8

Footnotes to Table I:
a. Substituents
A —CH₂CH₂O—CO—CH=CH—C₆H₅
B —CH₂CH₂CH₂O—CO—CH=CH—C₆H₅
C —CH₂CH₂CH₂NH—CO—CH=CH—C₆H₅

D —CH₂CH₂O—CO—CH=CH—(furyl, O)

E —CH₂CH₂CH₂O—CO—CH=CH—(furyl, O)

F —CH₂CH₂O—CO—CH=CH—(thienyl, S)

G —CH₂CH=CH₂
H —CH₂CH₂CH₂OH
I —CH₂CH₂OH
J —CH₂CH₃
K —C₆H₁₁
L —CH₂CH(OH)CH₂OH
M —CH₃
N —CH₂C₆H₅

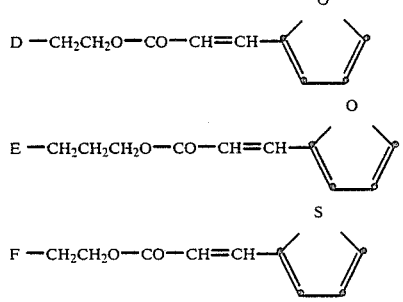
O —CH₂—C₆H₃(OCH₃)₂

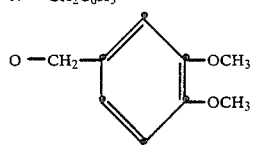

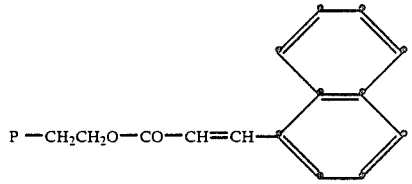
P —CH₂CH₂O—CO—CH=CH—(anthracenyl)

b. Remainder is a terpolymer with:
T = —[CH₂—C(CH₃)]ₓ—COOCH₂CH₂OOCCH₃
c. Remainder is a terpolymer with:
T = —(CH—CH₂)ₓ—C₆H₄CH₂N[CH₂CH₂OH]₃⁺ Cl⁻
d. "x" = 20 mol %
e. "x" = 30 mol %
f. "x" = 32 mol %
g. Remainder is a terpolymer with:
T = —[CH₂CH]ₓ—C₆H₄—CH₂N[CH₂CH=CH₂](CH₃)₃⁺ Cl⁻
h. "x" = 25 mol %

TABLE II

Combustion Analyses of Patternable Mordants Listed in Table I

| Compound | Calculated | | | | Found | | | |
|---|---|---|---|---|---|---|---|---|
| | C | H | N | Cl | C | H | N | Cl |
| 1.ᵃ | 70.1 | 7.5 | 3.5 | 11.5 | 70.1 | 7.6 | 4.6 | 11.8 |
| 2 | 71.1 | 7.0 | 3.8 | 9.5 | 70.6 | 6.9 | 3.5 | 7.3 |
| 3 | — | — | — | — | — | — | — | — |
| 4 | 71.0 | 7.5 | 4.4 | 11.1 | 71.0 | 7.4 | 4.2 | 11.2 |
| 5 | 70.2 | 7.8 | 4.6 | 12.2 | 70.2 | 7.8 | 3.5 | 12.0 |
| 6 | 69.1 | 7.4 | 4.4 | 11.1 | 69.3 | 7.9 | 4.5 | 11.4 |
| 7 | 68.9 | 7.7 | 4.5 | 11.3 | 66.4 | 7.7 | 4.4 | 11.1 |
| 8 | 68.4 | 7.9 | 4.6 | 11.7 | 64.2 | 7.9 | 4.3 | 11.5 |
| 9 | 67.8 | 8.0 | 4.8 | 12.2 | 66.4 | 7.6 | 4.6 | 11.8 |
| 10 | 67.2 | 8.2 | 5.0 | 12.7 | 64.3 | 7.7 | 4.7 | 12.3 |
| 11 | 69.4 | 7.6 | 4.3 | 10.9 | 69.1 | 7.6 | 4.2 | 11.1 |
| 12 | 68.0 | 7.4 | 4.2 | 10.7 | 67.3 | 7.6 | 4.1 | 11.1 |
| 13 | 70.0 | 7.6 | 4.8 | 12.1 | 69.2 | 7.8 | 4.9 | 12.5 |
| 14 | 71.9 | 8.0 | 4.3 | 10.9 | 68.0 | 7.4 | 3.7 | 9.7 |
| 15 | 71.0 | 7.8 | 4.3 | 10.9 | 70.9 | 7.7 | 4.0 | 10.8 |
| 16 | 71.8 | 7.6 | 7.3 | 9.2 | 69.4 | 7.7 | 6.9 | 9.0 |
| 17 | 71.6 | 7.7 | 7.2 | 9.6 | 69.0 | 7.5 | 6.9 | 8.3 |
| 18 | 71.3 | 7.7 | 7.2 | 10.1 | 66.2 | 7.2 | 6.5 | 8.3 |
| 19 | 71.1 | 7.8 | 7.2 | 10.6 | 68.5 | 7.6 | 6.7 | 9.5 |
| 20 | 70.8 | 7.9 | 7.1 | 11.2 | 67.9 | 7.5 | 6.5 | 8.9 |
| 21 | 66.5 | 7.8 | 6.1 | 10.3 | 67.0 | 7.7 | 5.6 | 10.0 |
| 22 | 71.5 | 7.6 | 7.0 | 9.3 | 67.4 | 7.2 | 6.5 | 8.0 |
| 23 | 71.3 | 7.6 | 6.7 | 9.4 | 69.9 | 7.5 | 6.5 | 8.2 |
| 24 | 71.0 | 7.6 | 6.4 | 9.5 | 69.6 | 7.4 | 6.1 | 9.1 |
| 25 | 70.7 | 7.6 | 6.1 | 9.6 | 69.4 | 7.4 | 5.9 | 8.6 |
| 26 | 71.9 | 7.7 | 7.1 | 9.5 | 64.3 | 7.5 | 6.1 | 8.3 |
| 27 | 71.9 | 7.9 | 6.9 | 9.7 | 71.0 | 7.7 | 6.8 | 7.3 |
| 28 | 72.0 | 8.0 | 6.7 | 10.0 | 69.3 | 7.8 | 6.4 | 8.3 |
| 29 | 72.2 | 8.2 | 6.5 | 10.3 | 71.2 | 7.9 | 6.4 | 8.4 |
| 30 | 72.3 | 8.3 | 6.3 | 10.7 | 66.6 | 7.8 | 5.7 | 10.3 |
| 31 | 69.6 | 7.8 | 6.8 | 10.8 | 68.6 | 8.0 | 6.6 | 11.4 |
| 32 | 70.6 | 7.6 | 4.4 | 11.2 | 70.6 | 8.0 | 4.2 | 10.9 |
| 33 | 69.5 | 7.6 | 4.3 | 10.8 | 70.2 | 8.0 | 4.1 | 10.6 |
| 34 | 69.8 | 7.7 | 4.2 | 10.6 | 66.2 | 7.7 | 3.8 | 10.4 |
| 35 | — | — | — | — | — | — | — | — |
| 36 | 70.6 | 7.4 | 3.8 | 9.6 | 70.6 | 7.4 | 3.6 | 9.4 |
| 37 | 72.8 | 7.4 | 4.0 | 10.2 | 71.7 | 7.3 | 3.9 | 9.9 |
| 38 | — | — | — | — | — | — | — | — |
| 39 | — | — | — | — | — | — | — | — |
| 40 | — | — | — | — | — | — | — | — |
| 41 | 67.2 | 7.4 | 3.6 | 9.1 | 63.4 | 7.8 | 3.8 | 9.8 |
| 42 | 69.9 | 8.1 | 6.2 | 10.5 | 68.1 | 7.8 | 6.0 | 10.1 |
| 43 | 68.7 | 8.2 | 6.0 | 10.8 | 65.6 | 8.3 | 5.6 | 10.9 |

ᵃEstimated by ¹H nmr to be mole ratio of 62/38 (±5) and by pyrolysis gas chromatography to be 61/39 (±3).

FORMULATION 1

The mordant formulation was prepared by dissolving 3.04 g poly-[N-(2-cinnamidoethyl)-N,N-dimethyl-N-(4-vinylbenzyl)ammonium chloride] (Compound 16) and 0.09 g of sensitizer S1, 5,7-di-N-propoxy-3-(4-cyanobenzoyl)coumarin in 20 ml of 2-ethoxy ethanol. The resulting solution was allowed to warm and roll overnight. The solution was filtered to 0.45 μm. Spin coating on SiO₂ at 2000 rpm produced a 1.11 μm film (refractive index=1.60). The coating was baked at 100° C. for 30 min in a convection oven.

Masked contact exposure was performed in an Oriel ™ exposure system using a 200 W high pressure Hg lamp that emits approximately equal peak intensities at 365, 405, and 436 nm radiation, with a total integrated intensity of 10 to 15 mW/cm². Exposures of 7-25 sec. all gave images which were readily developed in 19:1 volume ratio of water to acetone over 60 sec. The 2 μm lines were clear and well resolved with little distortion.

FORMULATION 2

Evaluation of resolution and photospeed for poly-(N-(3-cinnamidopropyl)-N,N-dimethyl-N-vinyl benzyl ammonium chloride-co-N,N,N-trimethyl-N-vinyl benzyl ammonium chloride] (90:10 molar ratio) (Compound 17)

Into a 30 ml brown bottle was weighed the following; 116 mg of sensitizer S2, 3-(7-methoxy-3-coumarinoyl)-1-methylpyridinium p-toluenesufonate, 2.555 g of Compound 17, 5 g of n-propanol and 10 g of distilled water to give a 15.1% solids solution. The bottle was tumbled until a clear solution was affected. The solution was then filtered through a Millex ® HA filter membrane (0.45 μm) utilizing a syringe. The filtered solution was coated onto 5 cm×5 cm quartz plates as well as 5 cm diameter silicon wafers having an 8000 Å thick surface layer of $SiO_2$. The coatings were made at 1000 rpm on a Headway ® spin coater. The coatings were then dried at 100° C. for 15 min. in a convection oven. Coating thicknesses were measured and found to be 0.83±0.09 μm. Absorption curves were obtained with the coatings on quartz which showed an absorbance due to the sensitizer of 0.3 optical density units for a 1 μm thick coating.

The coatings were exposed through a resolution target-step tablet combination using an Oriel ™ Model 8089 photoresist illumination head. The coatings were developed with a 3:1 molar ratio of n-propanol to n-butanol for 30 sec at 22° C. The developed coatings were dried at 100° C., 15 minutes as above. The thicknesses of the remaining images were measured at each exposure level. The resulting data was plotted as normalized thickness vs. log of exposure. A "speed" value was derived from these plots by taking the exposure value necessary to give 50% of the normalized thickness ($Dg^{\frac{1}{2}} = 24.0$ mJ/cm$^2$). That is, an exposure necessary to leave half of the original thickness of the patternable mordant layer after development consited of 24.0 mJ/cm$^2$. Micrographs of the images were also obtained which showed good resolution down to 3 μm lines and spaces.

FORMULATION 3

Evaluation of the photospeed of poly[-N-(2-cinnamatoethyl)-N,N-dimethyl-N-vinyl benzyl ammonium chloride-co-N-(3-hydroxypropyl)-N,N-dimethyl-N-vinyl benzyl ammonium chloride] (60:40 molar ratio) (Compound 11)

Same as Formulation 2, except for the following changes: Compound 11 was substituted for Compound 17. Coating solution solids were 12.1% in water, and coatings were made at 2000 rpm. Coating thicknesses obtained were 1:13±0.008 μm. Developer formulation consisted of a 4:1 molar ratio of n-propanol to n-butanol and $Dg^{\frac{1}{2}} = 7.9$ mJ/cm$^2$.

FORMULATION 4

Evaluation of the photospeed of poly-[N-(3-cinnamidopropyl)-N,N-dimethyl-N-vinyl benzyl ammonium chloride-co-N-(3,4-dimethoxyphenyl)-N,N-dimethyl-N-vinyl benzyl ammonium chloride] (90:10 molar ratio) (Compound 22)

Same as Formulation 2, except for the following changes: Compound 22 was substituted for Compound 17. Coating solution solids were 15.7% in a 4:1 volume ratio of N,N-dimethyl formamide to water. Coating thicknesses were 0.97±0.04 μm and developer was a 1:19 molar ratio of ethanol to n-propanol. $Dg^{\frac{1}{2}} = 19.5$ mJ/cm$^2$.

FORMULATION 5

Evaluation of the photospeed of poly-[N-(2-cinnamatoethyl)-N,N-dimethyl-N-vinyl benzyl ammonium chloride-co-N-(2-propenyl)-N,N-dimethyl-N-vinyl benzyl ammonium chloride] (40:60 molar ratio) (Compound 5)

Same as Formulation 2, except for the following changes: Compound 5 was substituted for Compound 17. The coating solution solids were 12.9% in water. Coating at 2000 rpm gave 1.01±0.07 μm coatings. The coatings were developed with a 4:1 molar ratio n-butanol to n-pentanol. $Dg^{\frac{1}{2}} = 14.2$ mJ/cm$^2$.

FORMULATION 6

Evaluation of the photospeed of poly-[N-(2-cinnamatoethyl)-N,N-dimethyl-N-vinyl benzyl ammonium chloride-co-N-(3-hydroxylpropyl)-N,N-dimethyl-vinyl benzyl ammonium chloride-co-N-(3-prop-2-ene)-N,N-dimethyl-N-vinyl benzyl ammonium chloride] (50:25:25 molar ratio) (Compound 44)

Same as Formulation 2, except for the following changes: Compound 44 was substituted for Compound 17. Coating solution solids were 13.9% in water. Coating at 2000 rpm gave 1.20±0.10 μm thick coatings. The coatings were developed with 2:3 molar ratio of n-propanol to n-butanol. $Dg^{\frac{1}{2}} = 14.2$ mJ/cm$^2$.

FORMULATION 7

Evaluation of the photospeed of poly-[N-(2'-ethyl-3-(α-naphthyl)propenoate)-N,N-dimethyl-N-vinyl benzyl ammonium chloride-co-N-(3-hydroxypropyl)-N,N-dimethyl-N-vinyl benzyl ammonium chloride] (60:40 molar ratio (Compound 45)

Same as Formulation 2, except for the following changes: Compound 45 was substituted for Compound 17. Coating solution solids were 12.9% in water. Coating at 2000 rpm to gave 0.94±0.10 μm thick coatings. The coatings were developed with n-propanol. $Dg^{\frac{1}{2}} = 4.0$ mJ/cm$^2$.

FORMULATION 8

Evaluation of the photospeed of poly-[N-(2'-ethyl-3-(2-thiofuran-yl)propenoate)-N,N-dimethyl-N-vinyl benzyl ammonium chloride-co-N-(3-hydroxy propyl)-N,N-dimethyl-N-vinyl benzyl ammonium chloride] (60:40 molar ratio) (Compound 46)

Same as Formulation 2, except for the following changes: Compound 46 was substituted for Compound 17. Coating solution solids were 14.9% solids in water. Coating at 2000 rpm gave $1.13 \pm 0.02$ μm thick coatings. The coatings were developed with a 1:4 molar ratio of ethanol to n-propanol. $Dg^{\frac{1}{2}} = 4.0$ mJ/cm$^2$.

FORMULATION 9

Evaluation of the photospeed of poly-[N-(2-cinnamatoethyl)-N,N-dimethyl-N-vinyl benzyl ammonium chloride-co-N,N,N-trimethyl-N-vinylbenzyl ammonium chloride] (Compound 1) and residual density of sensitizer S2

Same as Formulation 2, except for the following changes: Compound 1 was substituted for Compound 17. Coating solution solids were 13.7 percent by weight in water, and 5.5 percent sensitizer, based on total polymer, were employed. Coating at 2000 rpm on silicon gave a $1.11 \pm 0.04$ μm thick coating. The coating was developed with a 1:2 molar ratio of methanol to isobutanol. $Dg^{\frac{1}{2}} = 14.8$ mJ/cm$^2$. The absorption spectrum of a coating on a quartz plate showed an optical density of 0.3 attributable to the sensitizer for a 1 μm thick coating. The coating was flood exposed to 75 mJ/cm$^2$ of radiation and developed for 30 seconds. The subsequent measurement of optical density of the remaining film showed no absorption due to the sensitizer. Absorption of the patterned mordant layer was less than 0.01 optical density unit from 360 to 700 nm.

FORMULATION 10

Polymer in Formulation 9 with varied sensitizer S3

Same as Formulation 9, except for the following changes: Sensitizer S3, 3-(benzo[f]coumaroyl)-1-methylpyridinium p-toluenesulfonate, was substituted for sensitizer S2 in the coating solution in a concentration of 8.0 weight percent sensitizer, based on total polymer, and gave an optical density of 0.3 for a 1 μm thick coating before development. $Dg^{\frac{1}{2}} = 20.9$ mJ/cm$^2$.

FORMULATION 11

Polymer in Formulation 9 with varied sensitizer S4

Same as Formulation 9, except for the following changes: Sensitizer S4, 3-(5,7-dimethoxy-3-coumarinoyl)-1-methylpyridinium p-toluenesulfonate, was substituted for sensitizer S2 in the coating solution in a concentration of 6.2 weight percent sensitizer, based on total polymer. $Dg^{\frac{1}{2}} = 19.1$ mJ/cm$^2$.

FORMULATION 12

Polymer in Formulation 9 with varied sensitizer S5

Same as Formulation 9, except for the following changes: Sensitizer S5, 4-(5,7-dimethoxy-3-coumarinoyl)-1-methyl pyridinium p-toluenesulfonate, was substituted for sensitizer S2 in a concentration of 8.0 weight percent sensitizer, based on total polymer, and the coating solution contained total solids of 12.8 percent by weight in water. When coated the solution gave a 0.8 μm coating thickness. The coating was exposed to 200 mJ/cm$^2$ of 405 nm radiation using a Perkin-Elmer SRA 200 Censor ® stepper. Acceptable images were obtained after development with a 1:2 molar ratio of methanol to isobutanol.

FORMULATION 13

Evaluation of dye imbibition of Compound 1

A solution containing Compound 1, 10.9 percent by weight solids in water and 8.0 percent by weight S2 based on total polymer was spin coated on a glass wafer at 5000 rpm, contact exposed for 5 seconds using a Canon ®PLA501F aligner, developed for 30 seconds with a 1:2 molar ratio of methanol to isobutanol, and spun dry. The wafer was then placed in a dye bath containing 0.2 percent by weight of magenta dye MD-1 in water buffered to a pH of 10, left for 4 minutes, rinsed in water for 10 seconds, spun dry, placed in a solution of 4 percent by weight nickel acetate in a 1:1 volume ratio of methanol to water for 30 seconds, rinsed, and spun dry. The resulting magenta dyed layer had an optical density of 1.8. The dyed layer was then placed in a water bath for 10 minutes and then dried. There was no evidence of dye loss, and the optical density remained at 1.8.

FORMULATION 14

Evaluation of dye imbibition of Compound 8 and the stability of the coating solution A solution containing Compound 8, 12.9 percent by weight solids in water and 8.4 percent by weight S2, based on total polymer, was spin coated on a glass wafer at 2500 rpm, exposed for 10 seconds using a Canon ® PLA501F aligner, developed for 30 seconds in n-propanol, and spun dry. The original coating thickness was 0.82 μm, and the gelpoint exposure (as defined by W. H. Stockmeyer, *J. Chem. Phys.*, 12, 1944, p. 125) was 1.38 sec. The wafer was then placed in a dye bath containing 0.5 weight percent yellow dye YD-21 in water buffered to a pH of 10, left for 4 minutes, rinsed in water for 10 seconds, and spun dry. The resulting yellow dyed layer had an optical density of 2.2.

The second glass wafer was baked at 200° C. for 12 min prior to being placed in the dye bath. There was no measurable absorbance in the coating due the dye.

The coating solution was stored at room temperature in a brown bottle. After 63 days the solution was again coated, exposed, and developed as described above. The coating thickness was 0.85 μm, and the gelpoint exposure was 1.38 sec, which confirmed the stability of the coating solution.

The invention has been described in detail with particular reference to preferred embodiments thereof, but it will be understood that variations and modifications can be effected within the spirit and scope of the invention.

What is claimed is:

1. A photographically negative-working patternable mordant composition consisting essentially of a triplet sensitizer exhibiting an intersystem crossing efficiency from its singlet to triplet states of greater than 20 percent capable of absorbing radiation in the visible and near ultraviolet portions of the spectrum and, responsive to energy received from said triplet sensitizer, a photocrosslinkable polymer for providing both mordanting and crosslinking sites comprised of repeating units of the formula:

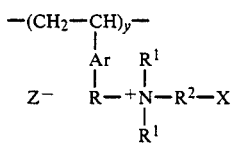

and

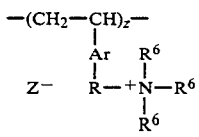

wherein
Ar is a phenylene linking group;
R is a methylene group;
$R^1$ is independently in each occurrence a lower alkyl group;
$R^2$ is a divalent linking group;
$R^6$ is independently in each occurrence a hydrocarbon group or an oxy substituted hydrocarbon group containing from 1 to 16 carbon atoms, provided that in at least two occurrences $R^6$ contains from 1 to 3 carbon atoms;
X is a photocrosslinking group comprised of an activated vinyl moiety chosen from the class consisting of

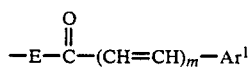

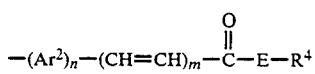

and

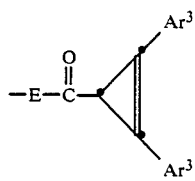

$Ar^1$ and $Ar^3$ are independently selected aromatic moieties containing from 6 to 10 carbon atoms;
$Ar^2$ is a divalent aromatic moiety containing from 6 to 10 carbon atoms;
E is an oxy or imino moiety;
m is 1 or 2;
n is 0 or 1;
$R^4$ is an aryl group containing from 6 to 10 carbon atoms or an alkyl group containing from 1 to 6 carbon atoms;
y represents 20 to 100 percent of the total repeating units of the polymer;
z represents 0 to 80 percent of the total repeating units of the polymer; and
Z is a charge balancing counter ion;
said sensitizer being present in a concentration of from about 0.1 to 100 percent, based on the weight of said polymer.

2. A photographically negative-working patternable mordant composition according to claim 1 wherein the hydrocarbon moieties of $R^6$ are chosen from among alkyl, including cycloalkyl, or alkenyl containing from 1 to 6 carbon atoms, aryl containing 6 to 10 carbon atoms, or alkaryl containing 7 to 16 carbon atoms.

3. A photographically negative-working patternable mordant composition according to claim 2 wherein $R^6$ in one occurrence is an allyl group.

4. A photographically negative-working patternable mordant composition according to claim 2 wherein $R^6$ is in at least one occurrence alkyoxy or hydrodroxy substituted.

5. A photographically negative-working patternable mordant composition according to claim 4 wherein $R^6$ is in at least one occurrence an omega-hydroxy alkyl group containing 1 to 3 carbon atoms.

6. A photographically negative-working patternable mordant composition according to claim 1 wherein
y represents 30 to 60 percent of the total repeating units forming the polymer and
z represents 40 to 70 percent of the total repeating units forming the polymer.

7. A photographically negative-working patternable mordant composition according to claim 1 wherein X is chosen from the group consisting of
$-CH_2CH_2O-CO-CH=CH-C_6H_5$,
$-CH_2CH_2CH_2O-CO-CH=CH-C_6H_5$,
$-CH_2CH_2CH_2NH-CO-CH=CH-C_6H_5$,

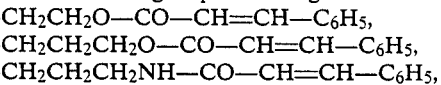

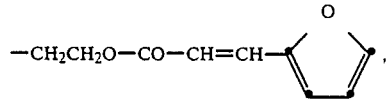

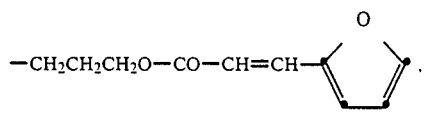, and

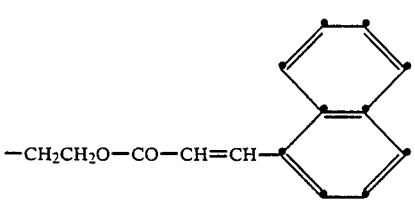

8. A photographically negative-working patternable mordant composition according to claim 1 wherein $R^6$ is in at least one occurrence selected from the group consisting of
$-CH_2CH=CH_2$,
$-CH_2CH_2CH_2OH$,
$-CH_2CH_2OH$,
$-CH_2CH_3$,
$-C_6H_{11}$, and
$-CH_2CH(OH)CH_2OH$.

9. A photographically negative-working patternable mordant composition according to claim 1 wherein the sensitizer is a coumarin sensitizer satisfying the formula:

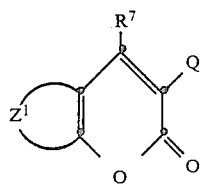

wherein $R^7$ is hydrogen, lower alkyl, or aryl of from 6 to 10 carbon atoms;

$Q_8$ is —CN or —$X^1$—$R^8$;

$R^8$ is alkyl of from 1 to 12 carbon atoms; alkenyl of from 2 to 12 carbon atoms; aryl of from 6 to 10 carbon atoms; a carbocyclic group of from 5 to 12 carbon atoms; or a heterocyclic group containing from 5 to 15 nuclear carbon and hetero atoms;

$X^1$ is carbonyl, sulfonyl, sulfinyl, or arylenedicarbonyl; and $Z^1$ represents the atoms completing an aromatic carbocyclic nucleus.

10. A photographically negative-working patternable mordant composition according to claim 1 wherein the sensitizer is a thiazoline or selenazoline triplet sensitizer satisfying the formula:

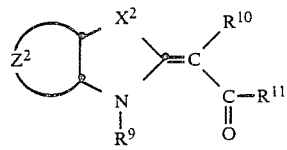

wherein $R^9$ is a lower alkyl group;

$R^{10}$ is hydrogen —$C(O)R^{10}$;

$R^{11}$ is a furyl or thienyl; and $Z^2$ represents the atoms completing an aromatic carbocyclic nucleus.

11. A negative-working photographic element comprised of a support and, coated on said support, a layer of a photographically negative-working patternable mordant composition according to claim 1.

* * * * *